US010437398B2

(12) United States Patent
Wang et al.

(10) Patent No.: US 10,437,398 B2
(45) Date of Patent: Oct. 8, 2019

(54) TOUCH SUBSTRATE AND METHOD FOR MANUFACTURING THE SAME AND TOUCH SCREEN

(71) Applicants: BOE Technology Group Co., Ltd., Beijing (CN); Hefei Xinsheng Optoelectronics Technology Co., Ltd., Anhui (CN)

(72) Inventors: Qingpu Wang, Beijing (CN); Ming Hu, Beijing (CN); Tsung-Chieh Kuo, Beijing (CN); Lei Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/559,928

(22) PCT Filed: Feb. 24, 2017

(86) PCT No.: PCT/CN2017/074698
§ 371 (c)(1),
(2) Date: Sep. 20, 2017

(87) PCT Pub. No.: WO2017/219695
PCT Pub. Date: Dec. 28, 2017

(65) Prior Publication Data

US 2019/0012011 A1 Jan. 10, 2019

(30) Foreign Application Priority Data

Jun. 21, 2016 (CN) .......................... 2016 1 0454680

(51) Int. Cl.
*G06F 3/044* (2006.01)
*G03F 7/00* (2006.01)

(52) U.S. Cl.
CPC ............ *G06F 3/044* (2013.01); *G03F 7/0007* (2013.01); *G06F 2203/04103* (2013.01)

(58) Field of Classification Search
CPC ........... G06F 3/044; G06F 2203/04103; G03F 7/0007
See application file for complete search history.

(56) References Cited

U.S. PATENT DOCUMENTS 9,176,622 B1 11/2015 Jin et al.
2013/0265244 A1 10/2013 Kim et al.
(Continued)

FOREIGN PATENT DOCUMENTS

CN 103744568 A 4/2014
CN 103913871 7/2014
(Continued)

OTHER PUBLICATIONS

Search Report and Written Opinion from PCT/CN2017/074698, dated Jun. 2, 2017 including the English Translation.
(Continued)

*Primary Examiner* — Premal R Patel
(74) *Attorney, Agent, or Firm* — Westman, Champlin & Koehler, P.A.

(57) ABSTRACT

The present disclosure provides a touch substrate and a method for manufacturing the same and a touch screen, and belongs to the field of touch technology. The touch substrate comprises a touch area and a non-touch area surrounding the touch area with a black matrix pattern provided thereon. The touch substrate further comprises: a plurality of touch electrodes provided on the touch area and the non-touch area, wherein at least one of the plurality of touch electrodes overlaps with the black matrix pattern; dummy electrode patterns, provided in gaps between adjacent touch electrodes, wherein a dummy electrode pattern between touch
(Continued)

electrodes overlapped on the black matrix pattern comprises a plurality of dummy electrode blocks that are insulated from each other.

12 Claims, 3 Drawing Sheets

(56) References Cited

U.S. PATENT DOCUMENTS

| | | | | |
|---|---|---|---|---|
| 2015/0062457 | A1* | 3/2015 | Kida ........................ | G06F 3/044 349/12 |
| 2016/0103523 | A1 | 4/2016 | Chen et al. | |
| 2016/0147344 | A1 | 5/2016 | Yuan et al. | |
| 2018/0181226 | A1 | 6/2018 | Zheng et al. | |

FOREIGN PATENT DOCUMENTS

| | | | |
|---|---|---|---|
| CN | 104111755 | | 10/2014 |
| CN | 201447116 | | 1/2015 |
| CN | 104331205 | A | 2/2015 |
| CN | 204288167 | U | 4/2015 |
| CN | 205028254 | | 2/2016 |
| CN | 106055147 | A | 10/2016 |
| CN | 106201134 | | 12/2016 |

OTHER PUBLICATIONS

First Office Action, including Search Report, for Chinese Patent Application No. 201610454680.3, dated Jul. 4, 2018, 13 pages.

* cited by examiner

TOUCH SUBSTRATE AND METHOD FOR MANUFACTURING THE SAME AND TOUCH SCREEN

CROSS-REFERENCE TO RELATED APPLICATION(S)

This application is a Section 371 National Stage Application of International Application No. PCT/CN2017/074698, filed on Feb. 24, 2017, which has not yet published and claims priority to the Chinese Patent Application No. 201610454680.3, filed on Jun. 21, 2016, entitled "TOUCH SUBSTRATE AND METHOD FOR MANUFACTURING THE SAME AND TOUCH SCREEN," which is incorporated herein by reference in its entirety.

TECHNICAL FIELD

The present disclosure relates to the field of touch technology, and more particularly, to a touch substrate and a method for manufacturing the same and a touch screen.

BACKGROUND

In recent years, with the improvement of controllability of mobile electronic devices and the development of the electronic technology, the touch screen technology has a wide range of applications in electronic devices such as a mobile phone, a tablet, a laptop computer and the like. The touch screen technology develops in different technical directions such as resistive, capacitive, electromagnetic directions and the like, and capacitive touch screens have become the mainstream products due to low cost and excellent user experience.

With rapid growth of the capacitive touch screens, people have increasing requirements for Electro-Static Discharge (ESD) performance of touch products. ESD may cause deterioration of performance of devices in a touch screen or breakdown of the devices which results in permanent failure, such as open or short circuit in the touch screen.

A conventional touch substrate comprises a touch area for touch detection and a black matrix pattern surrounding the touch area. Touch electrodes and dummy electrodes located in gaps between adjacent touch electrodes are formed on a touch substrate, and the dummy electrodes function to adjust mutual capacitance and match refractive index. The black matrix pattern is generally made of carbon balls. Generally, the black matrix pattern has good insulation performance, but after multiple high-temperature manufacturing processes, the black matrix pattern has reduced resistivity and decreased insulating property. In this way, when electrostatic charges of a device or a human body contact electrode blocks on the black matrix pattern, large discharge current is instantaneously formed between different electrode blocks, which results in breakdown of the black matrix pattern and causes open or short circuit between the electrode blocks, thereby resulting in deterioration of the touch performance or permanent failure of corresponding areas. After massive data validation, it is found that breakdown between different electrode blocks usually occurs between a touch electrode and adjacent dummy electrodes.

SUMMARY

In an aspect, there is provided a touch substrate, comprising a touch area and a non-touch area surrounding the touch area with a black matrix pattern provided thereon. The touch substrate further comprises: a plurality of touch electrodes provided on the touch area and the non-touch area, wherein at least one of the plurality of touch electrodes overlaps with the black matrix pattern; dummy electrode patterns, provided in gaps between adjacent touch electrodes, wherein a dummy electrode pattern between touch electrodes overlapped on the black matrix pattern comprises a plurality of dummy electrode blocks that are insulated from each other.

In one embodiment, the dummy electrode pattern between the touch electrodes overlapped on the black matrix pattern comprises a plurality of dummy electrode blocks having equal area.

In one embodiment, each of the dummy electrode blocks has an area less than 0.06 $mm^2$.

In one embodiment, each of the dummy electrode blocks has an area between 0.03 $mm^2$ and 0.05 $mm^2$.

In one embodiment, each of the dummy electrode blocks has an area of 0.04 $mm^2$.

In one embodiment, the dummy electrode pattern between the touch electrodes overlapped on the black matrix pattern comprises at least one group of dummy electrode blocks, wherein each group of dummy electrode blocks at least comprises a first dummy electrode block and a second dummy electrode block, an area of the first the dummy electrode block is greater than an area of the second dummy electrode block, and a distance between the first dummy electrode block and the touch electrode is greater than a distance between the second dummy electrode block and the touch electrode.

In one embodiment, the second dummy electrode block is located between the touch electrode and the first dummy electrode block.

In one embodiment, the second dummy electrode block has an area less than 0.06 $mm^2$.

In one embodiment, the second dummy electrode block has an area between 0.03 $mm^2$ and 0.05 $mm^2$.

In one embodiment, the second dummy electrode block has an area of 0.04 $mm^2$.

In one embodiment, the touch substrate is a mutual capacitive touch substrate, and an area of a dummy electrode block which is adjacent to a touch sensing electrode is less than an area of a dummy electrode block which is not adjacent to the touch sensing electrode.

In one embodiment, a dummy electrode pattern in the non-touch area comprises a plurality of dummy electrode blocks that are insulated from each other, and the dummy electrode pattern in the touch area is maintained to be unchanged.

The embodiments of the present disclosure further provide a touch screen, comprising the touch substrate described above.

The embodiments of the present disclosure further provide a method for manufacturing a touch substrate comprising: providing a substrate comprising a touch area and a non-touch area; forming a black matrix pattern on the non-touch area; and forming a plurality of touch electrodes on the touch area and the non-touch area, so that at least one touch electrode overlaps with the black matrix pattern and dummy electrode patterns are formed in gaps between adjacent touch electrodes, wherein a dummy electrode pattern between touch electrodes overlapped on the black matrix pattern is formed to be comprises a plurality of dummy electrode blocks that are insulated from each other.

In one embodiment, comprises the plurality of dummy electrode blocks have equal area.

In one embodiment, the dummy electrode pattern between touch electrodes overlapped on the black matrix pattern comprises at least one group of dummy electrode blocks, wherein one group of dummy electrode blocks at least comprises a first dummy electrode block and a second dummy electrode block, an area of the first the dummy electrode block is greater than an area of the second dummy electrode block, and a distance between the first dummy electrode block and the touch electrode is greater than a distance between the second dummy electrode block and the touch electrode.

In one embodiment, the second dummy electrode block is formed to be located between the touch electrode and the first dummy electrode block.

In one embodiment, the second dummy electrode block has an area less than 0.06 $mm^2$.

In one embodiment, the touch substrate is a mutual capacitive touch substrate, and an area of a dummy electrode block adjacent to a touch sensing electrode of the mutual capacitive touch substrate is less than an area of a dummy electrode block not adjacent to the touch sensing electrode.

In one embodiment, the touch electrodes and the dummy electrode patterns are formed by one patterning process.

DETAILED DESCRIPTION

In order to make the technical problems, technical solutions and advantages to be solved in the embodiments of the present disclosure more apparent, the present disclosure will be described in detail below in conjunction with the accompanying drawings and specific embodiments.

Figure 1:
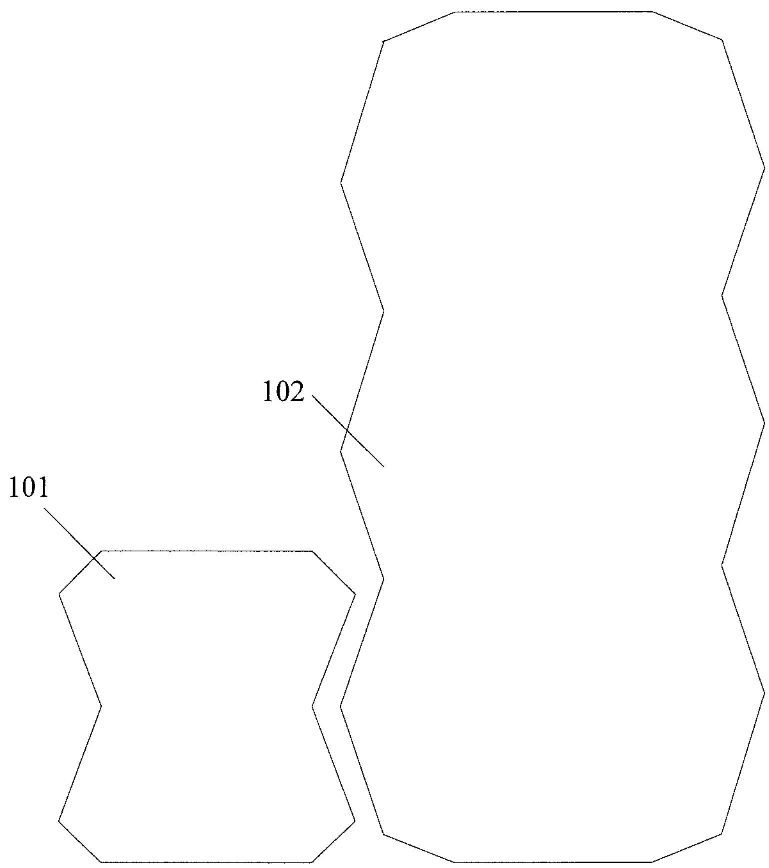
FIG. 1 is a diagram of a touch electrode and a dummy electrode in a conventional touch substrate.

FIG. 1 is a diagram of a touch electrode and a dummy electrode on a conventional touch substrate. As shown in FIG. 1, a dummy electrode 101 has a large area (greater than about 1 $mm^2$), which causes a black matrix pattern between a touch electrode 102 and an adjacent dummy electrode can be easily broken down. When the black matrix pattern is broken down by released electrostatic charges, capacitance of an edge area of the touch substrate (e.g. a non-touch area) becomes larger, which results in a poor touch performance. In order to at least partly avoid the above-mentioned problems, the embodiments of the present disclosure provide a touch substrate and a method for manufacturing the same and a touch screen, which can improve the anti-ESD capability of the touch screen.

The present embodiment provides a touch substrate, comprising a touch area and a non-touch area surrounding the touch area with a black matrix pattern provided thereon. The touch substrate further comprises: a plurality of touch electrodes provided on the touch area and the non-touch area, wherein at least one of the plurality of touch electrodes overlaps with the black matrix pattern; dummy electrode patterns, provided in gaps between adjacent touch electrodes, a dummy electrode pattern between touch electrodes overlapped on the black matrix pattern comprises a plurality of dummy electrode blocks that are insulated from each other.

ESD can easily occur between a touch electrode overlapped on the black matrix pattern and an adjacent dummy electrode pattern, and it is found through massive experimental validation that if an area of a dummy electrode block is reduced, a breakdown voltage of a black matrix pattern between the touch electrode and the dummy electrode block will be greatly increased. Therefore, in the present embodiment, the dummy electrode pattern in this area is designed as being comprised of a plurality of dummy electrode blocks that are insulated from each other, thereby reducing an area of a single dummy electrode block, which is equivalent to distributing electrostatic charges on the touch electrode to a plurality of dummy electrode blocks. In this way, the risk that the black matrix pattern can be broken down is greatly reduced, which improves the anti-ESD capability of the edge area of the touch electrode and thus enhances the anti-ESD capability of the overall product, thereby improving the production yield of the touch substrate.

The touch substrate according to the present embodiment may be a mutual capacitive touch substrate or may also be a self-capacitive touch substrate. When the touch substrate is a mutual capacitive touch substrate, the touch electrode comprises a touch sensing electrode and a touch driving electrode, a gap between adjacent touch sensing electrode and touch driving electrode has a dummy electrode pattern formed therein, and the dummy electrode pattern between the touch sensing electrode and the touch driving electrode overlapped on the black matrix pattern comprises a plurality of dummy electrode blocks that are insulated from each other. When the touch substrate is a self-capacitive touch substrate, the touch electrode is a self-capacitive touch electrode, a gap between adjacent self-capacitive touch electrodes has a dummy electrode pattern formed therein, and the dummy electrode pattern between the self-capacitive touch electrodes overlapped on the black matrix pattern comprises a plurality of dummy electrode blocks that are insulated from each other.

When the touch substrate is a mutual capacitive touch substrate, as breakdown of the black matrix pattern has a great impact on a touch sensing signal, the area of the dummy electrode block adjacent to the touch sensing electrode may be designed to be relatively small.

In addition, in the present embodiment, only the dummy electrode pattern between the touch electrodes overlapped on the black matrix pattern may be changed. The dummy electrode pattern located in a touch area at the center of the touch substrate may be the same as that in the prior art, that is, has an area which is designed to be relatively large. As there is no black matrix pattern in the touch area at the center of the touch substrate, ESD is less likely to occur. Therefore, the dummy electrode pattern in the touch area may not be changed, thereby avoiding affecting the performance of the touch substrate.

In a specific embodiment, each of dummy electrode patterns between the touch electrodes overlapped on the black matrix pattern comprises a plurality of dummy electrode blocks having equal area. In this way, electrostatic charges on the touch electrodes may be equally distributed to the plurality of dummy electrode blocks.

Figure 2:
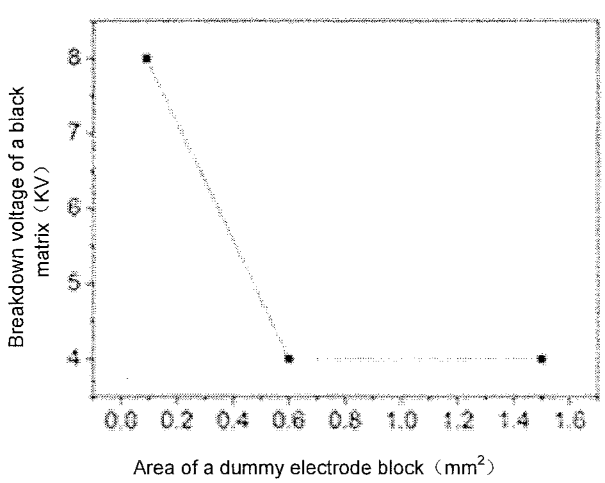
FIG. 2 is a diagram of a relationship between an area of a dummy electrode block and a breakdown voltage of a black matrix.

FIG. 2 is a diagram of a relationship between an area of a dummy electrode block and a breakdown voltage of a black matrix. It can be seen from FIG. 2 that when the area of the dummy electrode block is less than 0.06 $mm^2$, the breakdown voltage of the black matrix pattern is greatly increased, and therefore, in the present embodiment, the area of the dummy electrode block is designed to be less than 0.06 $mm^2$.

Preferably, the area of the dummy electrode block is between 0.03 $mm^2$ and 0.05 $mm^2$.

If the area of the dummy electrode block is designed to be too small, it may raise the requirements for the manufacturing process. If the area of the dummy electrode block is large, requirements for the breakdown voltage of the black matrix may not be satisfied. Therefore, with the requirements for the manufacturing process and the requirements for the breakdown voltage of the black matrix both taken into account, the area of the dummy electrode block may be designed to be 0.04 $mm^2$.

In another specific embodiment, the dummy electrode pattern between the touch electrodes overlapped on the black matrix pattern comprises at least one group of dummy electrode blocks, each group of dummy electrode blocks comprises a first dummy electrode block and a second dummy electrode block, an area of the first the dummy electrode block is greater than an area of the second dummy electrode block, and a distance between the first dummy electrode block and the touch electrode is greater than a distance between the second dummy electrode block and the touch electrode, i.e., a dummy electrode block further from the touch electrode is a larger dummy electrode block. That is, the area of the dummy electrode block adjacent to the touch sensing electrode is less than the area of the dummy electrode block which is not adjacent to the touch sensing electrode. This is particularly advantageous when the touch substrate is a mutual capacitive touch substrate.

In one embodiment, the second dummy electrode block is located between the touch electrode and the first dummy electrode block. In this way, when the electrostatic charges are released, the electrostatic charges can only be released to the large dummy electrode block after passing through the small dummy electrode block, thereby largely reducing the risk of damaging the black matrix pattern.

FIG. 2 is a diagram of a relationship between an area of a dummy electrode block and a breakdown voltage of a black matrix. It can be seen from FIG. 2 that when the area of the dummy electrode block is less than 0.06 $mm^2$, the breakdown voltage of the black matrix pattern is greatly increased. Therefore, in the present embodiment, the area of the second dummy electrode block is designed to be less than 0.06 $mm^2$. Of course, the area of the first dummy electrode block may also be designed to be small, for example, less than 0.09 $mm^2$.

Preferably, the area of the second dummy electrode block is between 0.03 $mm^2$ and 0.05 $mm^2$.

If the area of the second dummy electrode block is designed to be too small, it may raise the requirements for the manufacturing process. If the area of the second dummy electrode block is large, requirements for the breakdown voltage of the black matrix may not be satisfied. Therefore, with the requirements for the manufacturing process and the requirements for the breakdown voltage of the black matrix both taken into account, the area of the second dummy electrode block can be designed to be 0.04 $mm^2$.

The present embodiment further provides a touch screen comprising the touch substrate as described above. The touch screen may be applied in a human-computer interaction device.

The present embodiment further provides a method for manufacturing a touch substrate comprising: providing a substrate comprising a touch area and a non-touch area; forming a black matrix pattern on the non-touch area; and forming a plurality of touch electrodes on the touch area and the non-touch area, so that at least one touch electrode overlaps with the black matrix pattern and dummy electrode patterns are formed in gaps between adjacent touch electrodes, wherein a dummy electrode pattern between touch electrodes overlapped on the black matrix pattern is formed to be comprises a plurality of dummy electrode blocks that are insulated from each other.

ESD can easily occur between a touch electrode overlapped on the black matrix pattern and an adjacent dummy electrode pattern, and it is found through massive experimental validation that if an area of a dummy electrode block is reduced, a breakdown voltage of a black matrix pattern between the touch electrode and the dummy electrode block will be greatly increased. Therefore, in the present embodiment, each dummy electrode pattern in this area is designed as being comprised of a plurality of dummy electrode blocks that are insulated from each other, thereby reducing an area of a single dummy electrode block, which is equivalent to distributing electrostatic charges on the touch electrode to a plurality of dummy electrode blocks. In this way, the risk that the black matrix pattern can be broken down is greatly reduced, which improves the anti-ESD capability of the edge area of the touch electrode and thus enhances the anti-ESD capability of the overall product, thereby improving the production yield of the touch substrate.

In a specific embodiment, comprises the plurality of dummy electrode blocks have equal area. In this way, electrostatic charges on the touch electrodes may be equally distributed to the plurality of dummy electrode blocks.

In another specific embodiment, the dummy electrode pattern between touch electrodes overlapped on the black matrix pattern comprises at least one group of dummy electrode blocks, wherein each group of dummy electrode blocks at least comprises a first dummy electrode block and a second dummy electrode block, an area of the first the dummy electrode block is greater than an area of the second dummy electrode block, and a distance between the first dummy electrode block and the touch electrode is greater than a distance between the second dummy electrode block and the touch electrode, i.e., a dummy electrode block further from the touch electrode is a larger dummy electrode block.

In practical processes, the method may further comprise other steps. For example, an exemplary method for manufacturing a touch substrate may comprise the following detailed processes:

1. a first photoetching process, in which a black matrix pattern is formed on a substrate and covers an edge area of the substrate;

2. a second photoetching process, in which a bridge for connecting the touch electrodes is formed on the substrate;

3. a third photoetching process, in which a resin insulating layer which covers the bridge is formed on the substrate;

4. a fourth photoetching process, in which a pattern of the touch electrodes is formed on the substrate, and the touch electrodes are overlapped on the black matrix pattern in the edge area of the touch substrate;

5. a fifth photoetching process, in which a periphery metal trace is formed on the black matrix pattern on the substrate; and 6. a sixth photoetching process, in which a resin protection layer which at least covers the periphery metal trace is formed on the substrate.

In the present embodiment, the dummy electrode pattern is further formed while the touch electrode is formed in the fourth photoetching process, that is, the touch electrodes and the dummy electrode blocks are formed simultaneously by one patterning process. This makes it possible to realize the technical solutions of the present embodiment without increasing a number of patterning processes and increasing the difficulty of the manufacturing process of the touch substrate.

Figure 3:
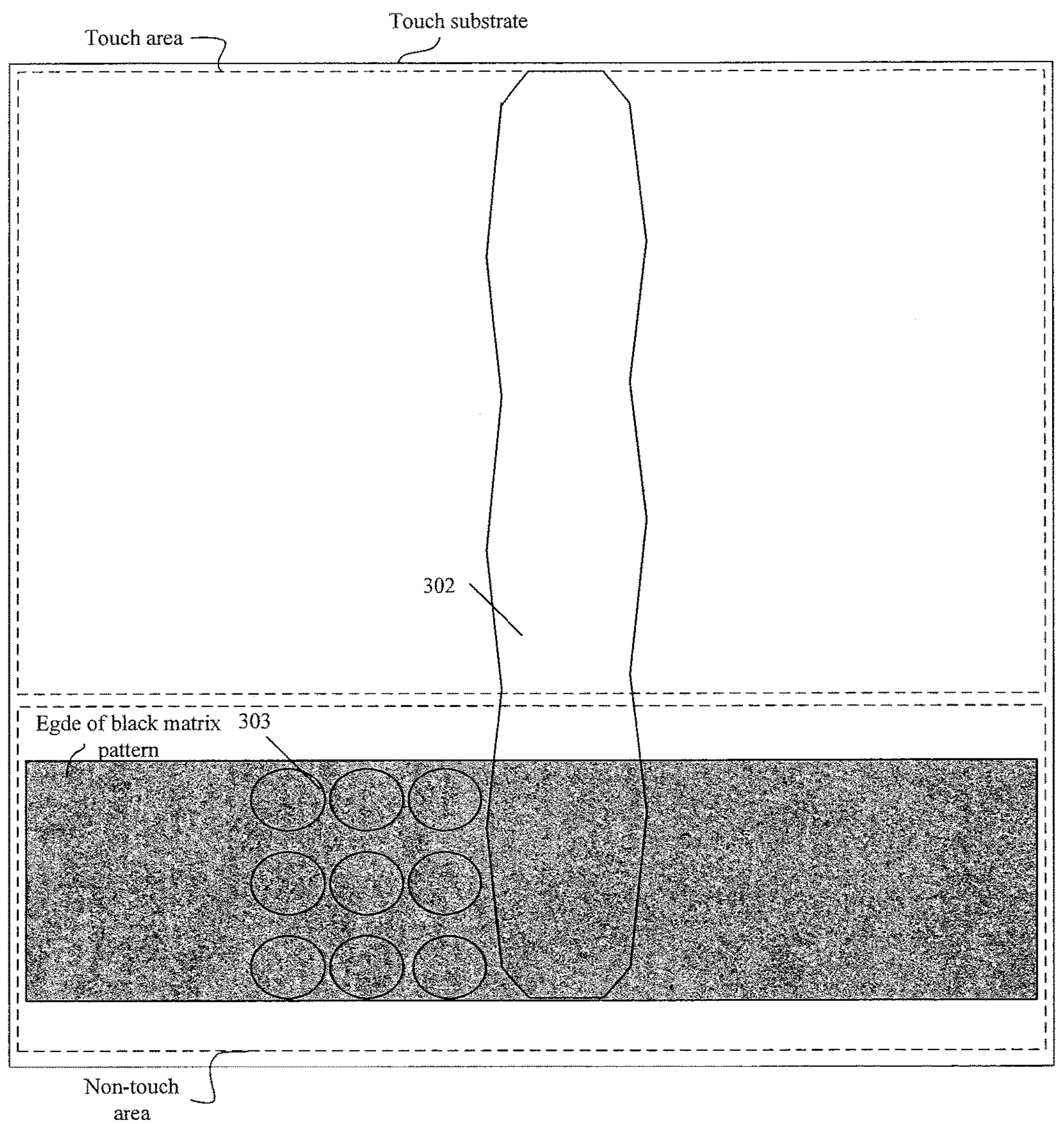
FIG. 3 is a diagram of dummy electrode blocks on a touch substrate according to an embodiment of the present disclosure.

FIG. 3 is a diagram of dummy electrode blocks on a touch substrate according to the present embodiment. The touch substrate comprises a touch area and a non-touch area surrounding the touch area with a black matrix pattern provided thereon. The touch substrate further comprises: a plurality of touch electrodes 302 provided on the touch area and the non-touch area, wherein at least one of the plurality of touch electrodes 302 overlaps with the black matrix pattern. The touch substrate further comprises: dummy electrode patterns, provided in gaps between adjacent touch electrodes 302. As shown in FIG. 3, the dummy electrode pattern between the touch electrodes 302 overlapped on the black matrix pattern comprises a plurality of dummy electrode blocks 303 that are insulated from each other. It is noted that FIG. 3 only shows a portion of the touch substrate near edge of the black matrix pattern for ease of illustration.

In the present embodiment, the dummy electrode pattern comprises 9 dummy electrode blocks 303 which have equal area. Of course, a number of the dummy electrode blocks 303 is not limited to 9, and may also be another natural number greater than 2. FIG. 2 is a diagram of a relationship between an area of a dummy electrode block and a breakdown voltage of a black matrix. It can be seen from FIG. 2 that when the area of the dummy electrode block is less than 0.06 $mm^2$, the breakdown voltage of the black matrix pattern is greatly increased. Therefore, in the present embodiment, the area of the dummy electrode block is designed to be less than 0.06 $mm^2$, and specifically may be 0.04 $mm^2$. This reduces an area of a single dummy electrode block, which is equivalent to distributing electrostatic charges on the touch electrode to a plurality of small dummy electrode blocks. In this way, the risk that the black matrix pattern is broken down is greatly reduced, which improves the anti-ESD capability of the edge area of the touch electrode and thus enhances the anti-ESD capability of the overall product, thereby improving the production yield of the touch substrate.

The dummy electrode blocks and the touch electrodes according to the present embodiment may be formed simultaneously by one patterning process. This makes it possible to realize the technical solutions of the present embodiment without increasing a number of patterning processes and increasing the difficulty of the manufacturing process of the touch substrate.

Figure 4:
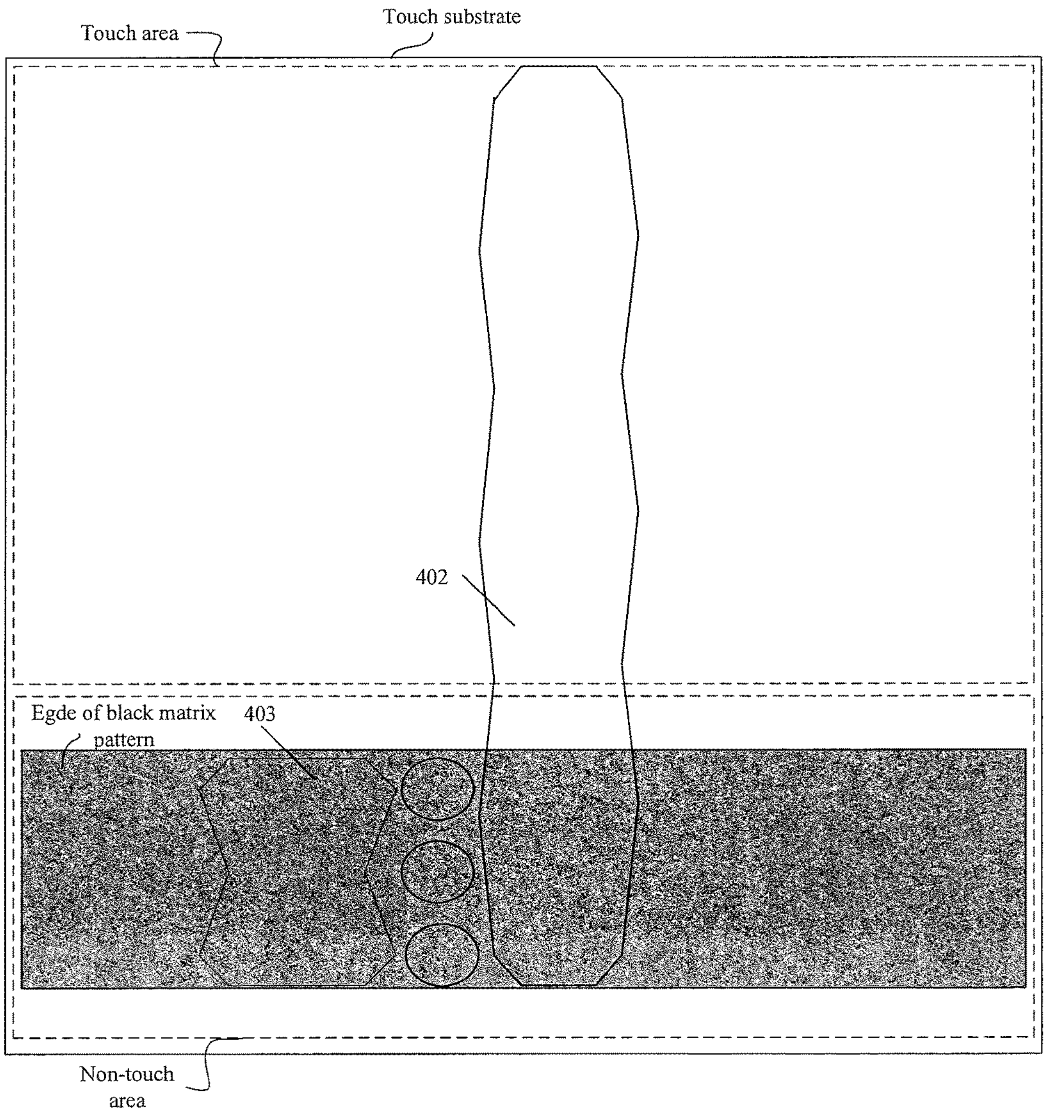
FIG. 4 is a diagram of dummy electrode blocks on a touch substrate according to another embodiment of the present disclosure.

FIG. 4 is a diagram of dummy electrode blocks on a touch substrate according to the present embodiment. The touch substrate comprises a touch area and a non-touch area surrounding the touch area with a black matrix pattern provided thereon. The touch substrate further comprises: a plurality of touch electrodes 402 provided on the touch area and the non-touch area, wherein at least one of the plurality of touch electrodes 402 overlaps with the black matrix pattern. The touch substrate further comprises: dummy electrode patterns, provided in gaps between adjacent touch electrodes. As shown in FIG. 4, the dummy electrode pattern between the touch electrodes 402 overlapped on the black matrix pattern comprises a plurality of dummy electrode blocks 403 that are insulated from each other.

In the present embodiment, the dummy electrode pattern comprises 3 small dummy electrode blocks 403 and 1 large dummy electrode block 403. The 3 small dummy electrode blocks 403 have equal area, and the small dummy electrode blocks 403 are located between the large dummy electrode block and the touch electrode 402.

It can be seen from FIG. 2 that when the area of the dummy electrode block is less than 0.06 $mm^2$, the breakdown voltage of the black matrix pattern is greatly increased. Therefore, in the present embodiment, the area of the small dummy electrode blocks is designed to be less than 0.06 $mm^2$, and specifically may be 0.04 $mm^2$. In this way, when the electrostatic charges are released, the electrostatic charges can be released to the large dummy electrode block only after passing through the small dummy electrode blocks. In this way, the risk of damaging the black matrix pattern is largely reduced, which improves the anti-ESD capability of the edge area of the touch electrode and thus enhances the anti-ESD capability of the overall product, thereby improving the production yield of the touch substrate.

Of course, in the present embodiment, the area of the large dummy electrode block may also be designed to be small, for example, less than 0.09 $mm^2$.

The dummy electrode blocks and the touch electrodes according to the present embodiment may be formed simultaneously by one patterning process. This makes it possible to realize the technical solutions of the present embodiment without increasing a number of patterning processes and increasing the difficulty of the manufacturing process of the touch substrate.

The foregoing is preferred embodiments of the present disclosure and it should be noted that it will be apparent to those of ordinary skilled in the art that a number of improvements and modifications may further be made without departing from the principles of the present disclosure, and these improvements and modifications should also be regarded to be within the protection scope of the present disclosure.

The invention claimed is:

1. A touch substrate, comprising a touch area and a non-touch area surrounding the touch area with a black matrix pattern provided thereon, the touch substrate further comprising:

a plurality of touch electrodes, provided on the touch area and the non-touch area, wherein at least one of the plurality of touch electrodes overlaps with the black matrix pattern;

dummy electrode patterns, provided in gaps between adjacent touch electrodes, and a dummy electrode pattern between touch electrodes overlapped on the black matrix pattern comprises a plurality of dummy electrode blocks that are insulated from each other, wherein the plurality of dummy electrode blocks comprises first dummy electrode blocks not adjacent to a touch electrode and second dummy electrode blocks adjacent to a touch electrode, and an area of the first dummy electrode block is greater than an area of the second dummy electrode block, wherein the second dummy electrode block has an area less than 0.06 $mm^2$.

2. The touch substrate according to claim 1, wherein the second dummy electrode block is located between the touch electrode and the first dummy electrode block.

3. A touch screen, comprising the touch substrate according to claim 2.

4. The touch substrate according to claim 1, wherein the touch substrate is a mutual capacitive touch substrate, and an area of a dummy electrode block which is adjacent to a touch sensing electrode is less than an area of a dummy electrode block which is not adjacent to the touch sensing electrode.

5. The touch substrate according to claim 1, wherein a dummy electrode pattern in the non-touch area comprises a plurality of dummy electrode blocks that are insulated from each other.

6. A touch screen, comprising the touch substrate according to claim 1.

7. A method for manufacturing a touch substrate comprising:

providing a substrate comprising a touch area and a non-touch area;

forming a black matrix pattern on the non-touch area; and forming a plurality of touch electrodes on the touch area and the non-touch area, so that at least one touch electrode overlaps with the black matrix pattern and dummy electrode patterns are formed in gaps between adjacent touch electrodes, wherein a dummy electrode pattern between touch electrodes overlapped on the black matrix pattern is formed to be comprises a plurality of dummy electrode blocks that are insulated from each other, wherein the plurality of dummy electrode blocks comprises first dummy electrode blocks not adjacent to a touch electrode and second dummy electrode blocks adjacent to a touch electrode, and an area of the first dummy electrode block is greater than an area of the second dummy electrode block, wherein the second dummy electrode block has an area less than 0.06 $mm^2$.

8. The method according to claim 7, wherein the touch electrodes and the dummy electrode patterns are formed by one patterning process.

9. The method according to claim 7, wherein the second dummy electrode block is formed to be located between the touch electrode and the first dummy electrode block.

10. The method according to claim 7, wherein the touch substrate is a mutual capacitive touch substrate, and an area of a dummy electrode block adjacent to a touch sensing electrode of the mutual capacitive touch substrate is less than an area of a dummy electrode block not adjacent to the touch sensing electrode.

11. A touch substrate, comprising a touch area and a non-touch area surrounding the touch area with a black matrix pattern provided thereon, the touch substrate further comprising:

a plurality of touch electrodes, provided on the touch area and the non-touch area, wherein at least one of the plurality of touch electrodes overlaps with the black matrix pattern;

dummy electrode patterns, provided in gaps between adjacent touch electrodes, and a dummy electrode pattern between touch electrodes overlapped on the black matrix pattern comprises a plurality of dummy electrode blocks that are insulated from each other, wherein the dummy electrode pattern between touch electrodes overlapped on the black matrix pattern comprises a plurality of dummy electrode blocks having equal area, wherein each of the dummy electrode blocks has an area less than 0.06 $mm^2$.

12. A method for manufacturing a touch substrate comprising:

providing a substrate comprising a touch area and a non-touch area;

forming a black matrix pattern on the non-touch area; and forming a plurality of touch electrodes on the touch area and the non-touch area, so that at least one touch electrode overlaps with the black matrix pattern and dummy electrode patterns are formed in gaps between adjacent touch electrodes, wherein a dummy electrode pattern between touch electrodes overlapped on the black matrix pattern is formed to be comprises a plurality of dummy electrode blocks that are insulated from each other, wherein the plurality of dummy electrode blocks have equal area, wherein each of the dummy electrode blocks has an area less than 0.06 $mm^2$.

* * * * *